(12) United States Patent  (10) Patent No.: US 7,926,007 B2
Shibata  (45) Date of Patent: Apr. 12, 2011

(54) WRITING APPARATUS, WRITING DATA CONVERSION METHOD, AND COMPUTER-READABLE RECORDING MEDIUM STORING PROGRAM USING HUFFMAN TREE FOR CONVERTING WRITING DATA IN LITHOGRAPHIC PROCESS

(75) Inventor: Hayato Shibata, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 265 days.

(21) Appl. No.: 12/360,214

(22) Filed: Jan. 27, 2009

(65) Prior Publication Data

US 2009/0194710 A1    Aug. 6, 2009

(30) Foreign Application Priority Data

Feb. 4, 2008  (JP) ................................. 2008-023577

(51) Int. Cl.
*G06F 17/50* (2006.01)
(52) U.S. Cl. ............... 716/55; 341/63; 341/67; 382/246
(58) Field of Classification Search .................... 716/55; 341/63, 67; 382/246
See application file for complete search history.

(56) References Cited

U.S. PATENT DOCUMENTS

| 4,121,259 | A  | * | 10/1978 | Preuss et al. | ................. | 382/246 |
| 5,675,332 | A  | * | 10/1997 | Limberg | ......................... | 341/67 |
| 6,865,668 | B1 | * | 3/2005 | Benes et al. | ................. | 712/300 |
| 7,365,658 | B2 | * | 4/2008 | Todorov et al. | ................. | 341/63 |

FOREIGN PATENT DOCUMENTS

JP   2007-128933   5/2007

OTHER PUBLICATIONS

Office Action issued Dec. 20, 2010 in corresponding Korean Patent Application No. 10-2009-8343 (with English translation).

* cited by examiner

*Primary Examiner* — Naum Levin
(74) *Attorney, Agent, or Firm* — Oblon, Spivak, McClelland, Maier & Neustadt, L.L.P.

(57) ABSTRACT

A writing apparatus includes a unit storing writing data, a unit which acquires pattern information on patterns defined in the data, a unit which generates a table where each pattern information corresponds to a number of times each pattern information is used, for each predetermined region, a unit which generates a Huffman tree, based on the table, a unit which generates another table where each pattern information corresponds to a variable length binary code generated by encoding each pattern information such that the larger the number of times each pattern information is used, the smaller a value of the code, based on the tree, a unit which produces converted data, which is defined by the data, in the region into a predetermined format using the code, based on the other table, and a unit which writes the patterns defined, onto a workpiece, based on the converted data in the region.

10 Claims, 9 Drawing Sheets

| Figure Size, x Coordinate, y Coordinate | Using Times |
|---|---|
| 0.10 | 1 |
| 0.12 | 1 |
| 0.50 | 2 |
| 0.90 | 5 |
| 0.11 | 10 |
| 0.80 | 12 |
| Sum | 31 |

94

| Code | Value |
|---|---|
| 0 | 0.80 |
| 11 | 0.11 |
| 101 | 0.90 |
| 1001 | 0.50 |
| 10001 | 0.12 |
| 10000 | 0.10 |

FIG. 7

Related Art

WRITING APPARATUS, WRITING DATA CONVERSION METHOD, AND COMPUTER-READABLE RECORDING MEDIUM STORING PROGRAM USING HUFFMAN TREE FOR CONVERTING WRITING DATA IN LITHOGRAPHIC PROCESS

CROSS-REFERENCE TO RELATED APPLICATION

This application is based upon and claims the benefit of priority from the prior Japanese Patent Application No. 2008-023577 filed on Feb. 4, 2008 in Japan, the entire contents of which are incorporated herein by reference.

BACKGROUND OF THE INVENTION

1. Field of the Invention

The present invention relates to a pattern writing apparatus and to a method for converting writing data. For example, the present invention relates to a writing apparatus which writes a predetermined pattern on a target workpiece by using an electron beam, and to a method for converting writing data to be processed in the writing apparatus.

2. Description of Related Art

The lithography technique that advances microscale semiconductor devices is extremely important as being the only process to form patterns in semiconductor manufacturing processes. In recent years, with high integration of large-scale integrated circuits (LSI), critical dimensions required for semiconductor device circuits are shrinking year by year. In order to form a desired wiring pattern on semiconductor devices, a master pattern (called a mask or a reticle) of high precision is required. The electron beam writing technique intrinsically having excellent resolution is used for producing such highly precise master patterns.

FIG. 11 is a schematic diagram illustrating operations of a variable-shaped electron beam (EB) type pattern writing apparatus. As shown in the figure, the variable-shaped electron beam writing apparatus, including two aperture plates, operates as follows: A first aperture plate 410 has a rectangular opening or "hole" 411 for shaping an electron beam 330. This shape of the rectangular opening may also be a square, a rhombus, a rhomboid, etc. A second aperture plate 420 has a variable-shaped opening 421 for shaping the electron beam 330 that passed through the opening 411 into a desired rectangular shape. The electron beam 330 emitted from a charged particle source 430 and having passed through the opening 411 is deflected by a deflector to pass through a part of the variable-shaped opening 421 and thereby to irradiate a target workpiece or "sample" 340 mounted on a stage which continuously moves in one predetermined direction (e.g. X direction) during the writing or "drawing." In other words, a rectangular shape formed as a result of passing through both the opening 411 and the variable-shaped opening 421 is written in the writing region of the target workpiece 340 on the stage. This method of forming a given shape by letting beams pass through both the opening 411 and the variable-shaped opening 421 is referred to as a "variable shaped" method.

When performing the electron beam writing, layout of a semiconductor integrated circuit is first designed, and then, layout data (design data), in which pattern layout is defined, is generated. Then, the layout data is converted into writing data which is adapted to the electron beam writing apparatus. The writing data is input into the writing apparatus, and, after plural data processing operations, generated as shot data to be used at the time of writing (refer to e.g., Japanese Patent Application Laid-open (JP-A) No. 2007-128933). Writing processing is performed based on the shot data. In the pattern writing apparatus, first, the writing data is developed into intermediate data prior to the shot data being generated. Conventionally, the pattern data format has been designed to respond to all possible sizes, coordinates, figure types, and the number of figures. Therefore, in the conventional pattern data format, the number of bits capable of responding to any of these is prepared.

However, depending on the layout of writing data, there is a case of using only a part of the number of bits prepared in the conventional pattern data format. For example, in the case of the layout where patterns of the same shape or the same size are mainly repeatedly used, only a few numbers of bits prepared in the conventional pattern data format are used. When only several patterns in one layout have such a case of only a few numbers of bits being used, they do not have much influence. However, with the recent trend of pattern miniaturization and pattern number increase, patterns using only a few numbers of bits are increasing. Therefore, if the numbers of bits which are not used are accumulated, it will become the number of bits corresponding to a data size not to be disregarded for the throughput of the apparatus.

As mentioned above, in the pattern data format conventionally used, the number of bits capable of responding to all possible sizes, coordinates, figure types, and the number of figures is prepared. Therefore, there are many unused bits, so that if the numbers of the unused bits are accumulated, it corresponds to a data size not to be disregarded for the throughput of the apparatus. As reducing the data size is requested with the recent trend of pattern miniaturization and pattern number increase, it is an issue how to reduce the number of bits used in the data.

BRIEF SUMMARY OF THE INVENTION

It is an object of the present invention to provide a writing apparatus and a method of converting writing data, for decreasing the number of bits so as to reduce the data size in the apparatus and by the method.

In accordance with one aspect of the present invention, a writing apparatus includes a storage unit configured to store writing data, an acquiring unit configured to acquire pattern information on a plurality of patterns defined in the writing data, based on the writing data, a first table generating unit configured to generate a first table in which each pattern information corresponds to a number of times of using the each pattern information, based on acquired pattern information, for each predetermined region, a Huffman tree generating unit configured to generate a Huffman tree, based on the first table, a second table generating unit configured to generate a second table in which the each pattern information corresponds to a variable length binary code generated by encoding the each pattern information in such a manner that the larger the number of times of using the each pattern information is, the smaller a value of the variable length binary code is, based on the Huffman tree, a converting unit configured to convert data, which is defined by the writing data, in the predetermined region into a predetermined format using the variable length binary code, based on the second table, and a writing unit configured to write the plurality of patterns defined, onto a target workpiece, based on converted data in the predetermined region.

In accordance with another aspect of the present invention, a method for converting writing data includes inputting writing data, acquiring pattern information on a plurality of patterns defined in the writing data, based on the writing data, generating a first table in which each pattern information corresponds to a number of times of using the each pattern information, based on acquired pattern information, for each predetermined region, generating a Huffman tree, based on the first table, generating a second table in which the each pattern information corresponds to a variable length binary code generated by encoding the each pattern information in such a manner that the larger the number of times of using the each pattern information is, the smaller a value of the variable length binary code is, based on the Huffman tree, converting data, which is defined by the writing data, in the predetermined region into a predetermined format using the variable length binary code, based on the second table, and storing converted data in the predetermined region.

Moreover, in accordance with another aspect of the present invention, a computer-readable recording medium storing a program to be executed by a computer, the program includes storing writing data, in which pattern information on a plurality of patterns is defined, in a storage device, acquiring pattern information on a plurality of patterns defined in the writing data which is read from the storage device, generating a first table in which each pattern information corresponds to a number of times of using the each pattern information, based on acquired pattern information, for each predetermined region, generating a Huffman tree, based on the first table, generating a second table in which the each pattern information corresponds to a variable length binary code generated by encoding the each pattern information in such a manner that the larger the number of times of using the each pattern information is, the smaller a value of the variable length binary code is, based on the Huffman tree, converting data, which is defined by the writing data, in the predetermined region into a predetermined format using the variable length binary code, based on the second table, and storing converted data in the predetermined region.

BRIEF DESCRIPTION OF THE DRAWINGS

FIG. 7 shows an example of a Huffman table corresponding to the Huffman tree of FIG. 6;

DETAILED DESCRIPTION OF THE INVENTION

In the following Embodiment, a structure utilizing an electron beam as an example of a charged particle beam will be described. The charged particle beam is not limited to the electron beam. Another charged particle beam, such as an ion beam, may also be used. Moreover, as an example of a charged particle beam apparatus, there will be described a charged particle beam writing apparatus, especially a variable shaped type electron beam writing apparatus.

Embodiment 1

Figure 1:
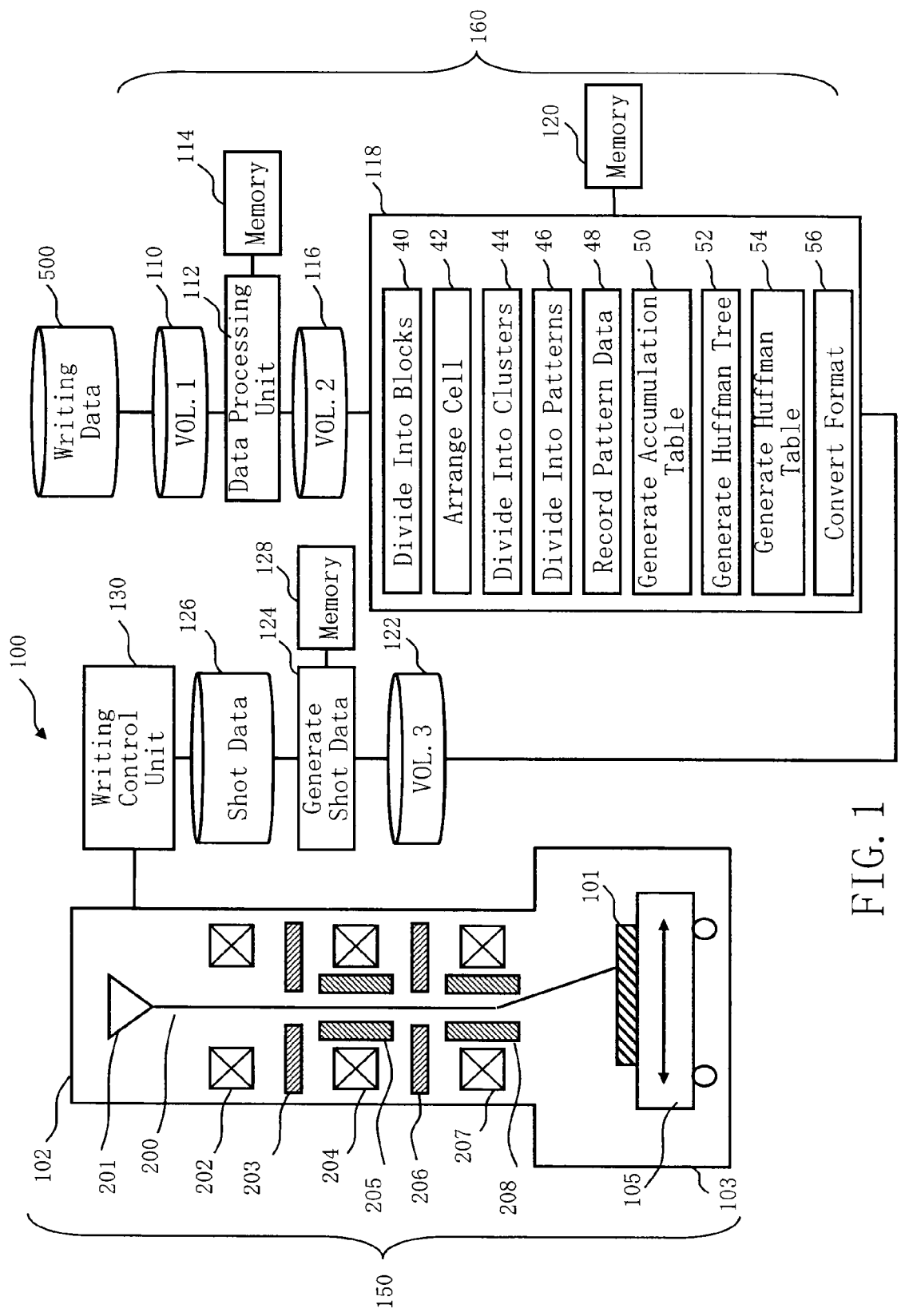
FIG. 1 is a schematic diagram illustrating a structure of a pattern writing apparatus according to Embodiment 1.

FIG. 1 is a schematic diagram illustrating the structure of a pattern writing apparatus according to Embodiment 1. In FIG. 1, a pattern writing apparatus 100 is an example of an electron beam pattern writing apparatus. The pattern writing apparatus 100 writes a pattern composed of a plurality of figures onto a target workpiece 101. The target workpiece 101 includes a mask to be used in the lithography step of manufacturing semiconductor devices. The pattern writing apparatus 100 includes a writing unit 150 and a control unit 160. The writing unit 150 includes a writing chamber 103 and an electron lens barrel 102 arranged above the writing chamber 103. In the electron lens barrel 102, there are arranged an electron gun assembly 201, an illumination lens 202, a first aperture plate 203, a projection lens 204, a deflector 205, a second aperture plate 206, an objective lens 207, and a deflector 208. In the writing chamber 103, there is an XY stage 105 on which the target workpiece 101 serving as a writing target is placed. The control unit 160 includes magnetic disk drives 110, 116, 122, and 126, a data processing unit 112, memories 114, 120, and 128, a control computer 118, a shot data generating unit 124, and a writing control unit 130. The magnetic disk drives 110, 116, 122 and 126, the data processing unit 112, the memories 114, 120 and 128, the control computer 118, the shot data generating unit 124, and the writing control unit 130 are mutually connected by buses (not shown). In the control computer 118, there are arranged a block division unit 40, a cell arranging unit 42, a cluster division unit 44, a pattern division unit 46, a pattern data recording unit 48, an accumulation table generating unit 50, a Huffman tree generating unit 52, a Huffman table generating unit 54, and a format converting unit 56. The magnetic disk drives 110, 116, 122 and 126 and the memories 114, 120 and 128 are examples of a storage unit or a storage device. Moreover, writing data is stored in an external magnetic disk drive 500.

The block division unit 40, the cell arranging unit 42, the cluster division unit 44, the pattern division unit 46, the pattern data recording unit 48, the accumulation table generating unit 50, the Huffman tree generating unit 52, the Huffman table generating unit 54, and the format converting unit 56 may be configured as processing functions executable by a computer, such as a CPU, that executes a program, or configured by hardware of an electric circuit. Alternatively, they may be executed by a combination of hardware of an electric circuit and software, or a combination of the hardware and firmware. When executed by software or combination with the software, each data to be input into the computer which performs processing, or each data being processed or having been processed is stored in the memory 120 each time. Similarly, the data processing unit 112 or the shot data generating unit 124 may be configured as processing functions executable by a computer, such as a CPU, that executes a program, or configured by hardware of an electric circuit. Alternatively, they may be executed by a combination of hardware of an electric circuit and software, or a combination of the hardware and firmware. When executed by software or combination with software, each data to be input into the computer which performs processing, or each data being or having been processed is stored in the memory 114 for the data processing unit 112, and in the memory 128 for the shot data generating unit 124 each time.

Moreover, the data processing unit 112, the control computer 118, and the shot data generating unit 124 may be configured by one computer or plural computers, respectively. A parallel processing can be performed by being configured by plural computers respectively, and thereby increasing the processing speed.

While FIG. 1 shows structure elements necessary for explaining Embodiment 1, it should be understood that other structure elements generally necessary for the pattern writing apparatus 100 may also be included.

Figure 2:
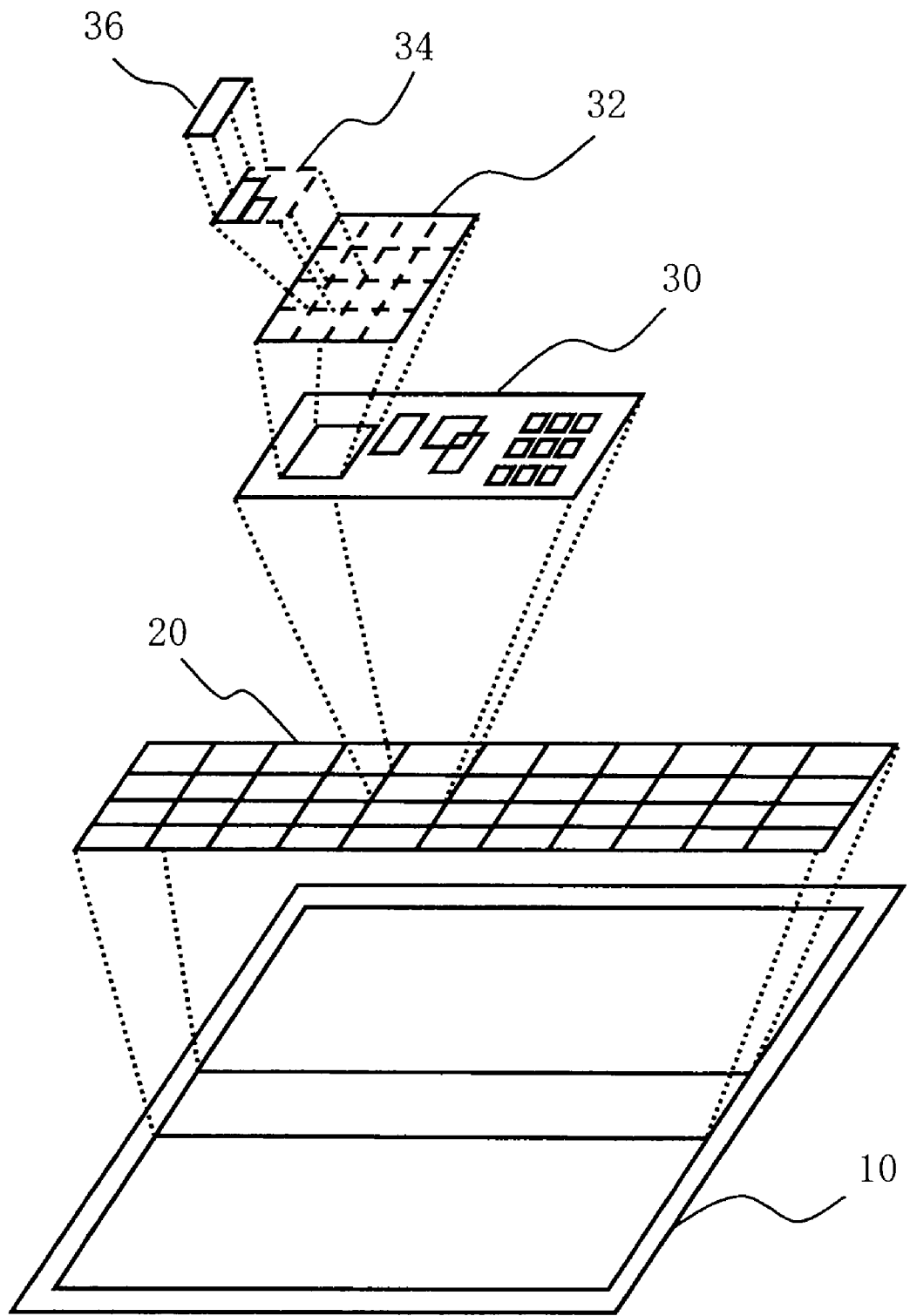
FIG. 2 shows an example of a hierarchical structure of writing data according to Embodiment 1.

FIG. 2 shows an example of a hierarchical structure of writing data according to Embodiment 1. In the writing data, a writing region or "writing area" has a hierarchical structure composed of a series of plural internal configuration units, such as a layer of a chip 10, a layer of a stripe 20 formed by virtually dividing the chip region into a plurality of strip-like portions in a certain direction, for example, the Y-axis direction, a layer of a block 30 formed by dividing the stripe 20, a layer of a cell 32 composed of at least one or more figures, a layer of a cluster 34 formed by dividing the cell 32, and a layer of a figure (pattern) 36 which is arranged in the cluster 34 and constitutes the cell 32. Generally, a plurality of chips is laid out in the writing region of one target workpiece 101. Therefore, in the data processing unit 112 mentioned later, chip merging is performed to configure a hierarchy as shown in FIG. 2. While the stripe 20 is herein formed by dividing the chip region into a plurality of strip-like portions arrayed in the Y-axis direction (predetermined direction) as an example, it may be divided into portions parallel to the drawing surface and arrayed in the direction of X-axis orthogonal to the Y-axis. Alternatively, it may be divided in other direction to be parallel to the drawing surface.

Figure 3:
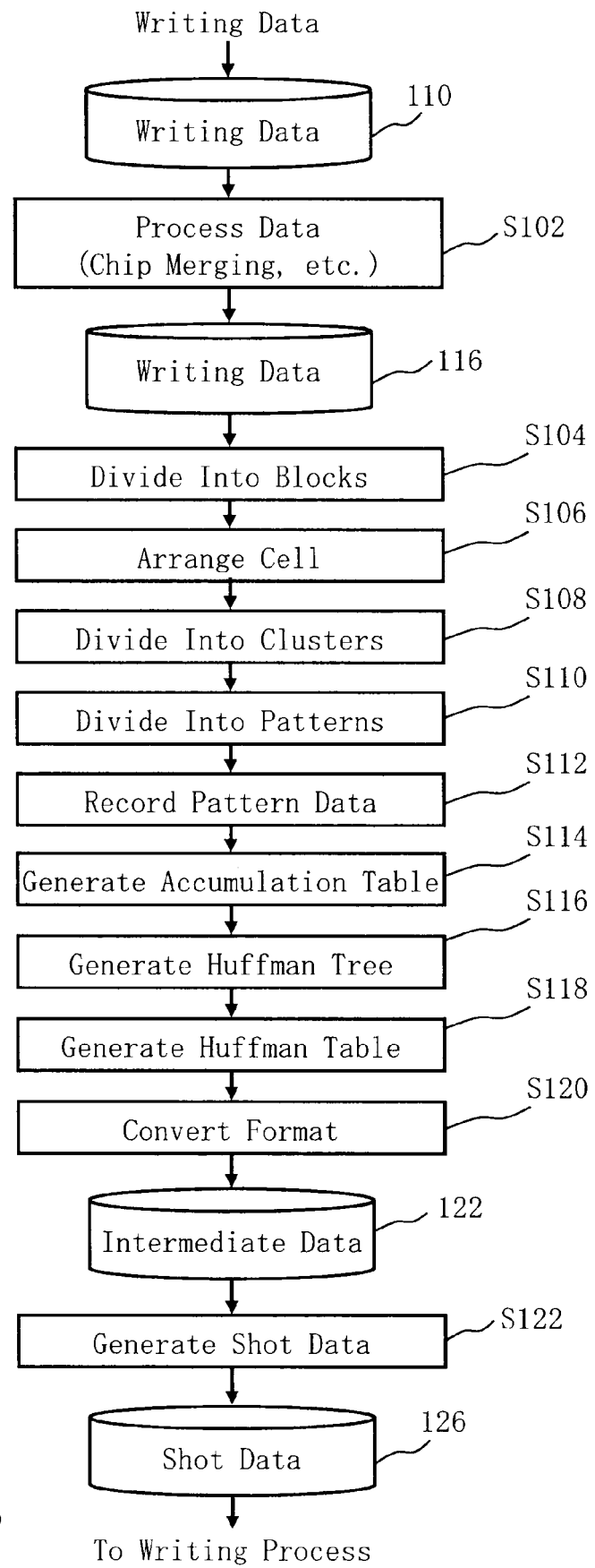
FIG. 3 is a flowchart showing a writing method according to Embodiment 1.

FIG. 3 is a flowchart showing a writing method according to Embodiment 1. As mentioned above, when writing with an electron beam, it starts with designing a layout of a semiconductor integrated circuit. Then, layout data (design data), in which pattern layout is defined, is generated. The layout data is converted into writing data adapted to be input into the writing apparatus 100. The writing data is read from the magnetic disk drive 500, input into the writing apparatus 100, and stored in the magnetic disk drive 110. After a plurality of data processing operations as mentioned later, the writing data is generated as shot data used at the time of writing.

In step S102, as a data processing step, the data processing unit 112 reads and inputs wring data of each of a plurality of chips from the magnetic disk drive 110. The data processing unit 112 rearranges the each writing data in the writing region of the pattern writing apparatus 100, and performs chip merging. Moreover, in addition to this, the data processing unit 112 may perform data processing, such as mirroring and scaling. After being processed as mentioned above, the writing data is stored in the magnetic disk drive 116.

In step S104, as a step of dividing into blocks, the block division unit 40 develops the writing data, which has been data processed in the prior step, so as to virtually divide the chip 10 or each stripe 20 into a plurality of blocks 30 as shown in FIG. 2.

In step S106, as a cell arrangement step, the cell arranging unit 42 further develops the writing data so as to arrange the laid out cell 32 in each block 30.

In step S108, as a step of dividing into clusters, the cluster division unit 44 further develops the writing data so as to virtually divide each cell 32 into a plurality of the clusters 34 as shown in FIG. 2.

In step S110, as a step of dividing into patterns, the pattern division unit 46 further develops the writing data so as to divide each cluster 34 into a plurality of figures 36 (patterns) laid out in each cluster 34 as shown in FIG. 2. By dividing into patterns, the pattern division unit 46 can acquire pattern data (pattern information) such as the number, types, sizes (L, M) and position coordinates (X, Y) of the figures 36 in each cluster 34. Thus, the pattern division unit 46 can acquire information on patterns defined in the writing data, based on the writing data. The pattern division unit 46 serves as an example of an acquiring unit.

In step S112, as a pattern data recording step, the pattern data recording unit 48 records (stores) the acquired pattern data such as the number, types, sizes (L, M) and position coordinates (X, Y) of the figure 36 in each cluster 34, into the memory 120.

In step S114, as an accumulation table generating step, the accumulation table generating unit 50 generates an accumulation table (first table) in which each pattern information corresponds to the number of times of using each pattern information, based on a plurality of acquired pattern information, for each cluster 34. The accumulation table generating unit 50 serves as an example of a first table generating unit. The generated accumulation table is stored in the memory 120.

Figures 4, 5:
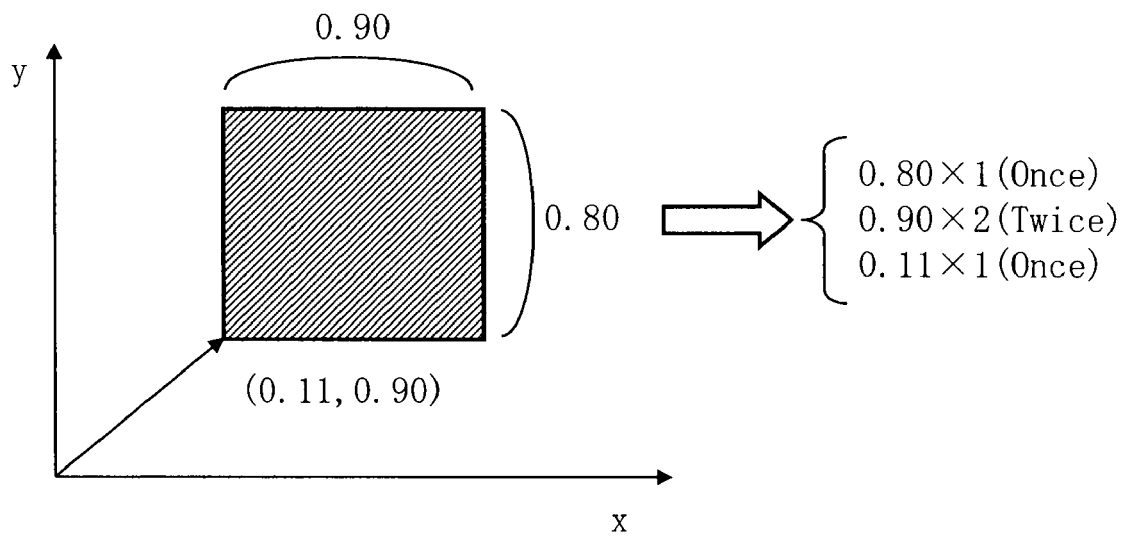
FIG. 4 shows an example of an accumulation table according to Embodiment 1.
FIG. 5 is a schematic diagram showing an example for explaining how to count the number of using times according to Embodiment 1.

FIG. 4 shows an example of the accumulation table according to Embodiment 1. In the accumulation table 60 of FIG. 4, each value of the figure sizes (M, L) and each value of the figure coordinates (x, y) are correspondingly defined to relate to the number of times of using each value. With respect to all the figure patterns arranged in the cluster 34, the number of times of the value of width M of the figure size, the value of height L of the figure size, the x value of the figure coordinates (x, y), or the y value of the figure coordinates (x, y) being 0.10 is counted and defined. In this case, the accumulated number of using times of 0.10 is "1" (once). Similarly, the number of times of 0.12 is counted and defined. In this case, the accumulated number of using times of 0.12 is "1" (once). Similarly, the number of times of 0.50 is counted and defined. In this case, the accumulated number of using times of 0.50 is "2" (twice). Similarly, the number of times of 0.90 is counted and defined. In this case, the accumulated number of using times of 0.90 is "5" (five times). Similarly, the number of times of 0.11 is counted and defined. In this case, the accumulated number of using times of 0.11 is "10" (ten times). Similarly, the number of times of 0.80 is counted and defined. In this case, the accumulated number of using times of 0.80 is "12" (twelve times). Then, the sum of these numbers of using times is "31" (thirty-one times).

FIG. 5 is a schematic diagram showing an example for explaining how to count the number of using times in Embodiment 1. FIG. 5 shows the case where a figure with the width 0.90 and the height 0.80 is arranged at the position of coordinates (0.11, 0.90) from the reference position of the cluster 34. Each unit is AU (arbitrary unit). In this case, the accumulation table 60 defines that the value 0.80 is used once, the value 0.90 is used twice, and the value 0.11 is used once. With respect to all the figures arranged in the cluster 34, the number of used times is similarly counted respectively to define the accumulated value.

In step S116, as a Huffman tree generating step, the Huffman tree generating unit 52 reads the accumulation table 60 from the memory 120, and generates a Huffman tree based on the accumulation table 60. The generated Huffman tree is stored in the memory 120.

Figure 6:
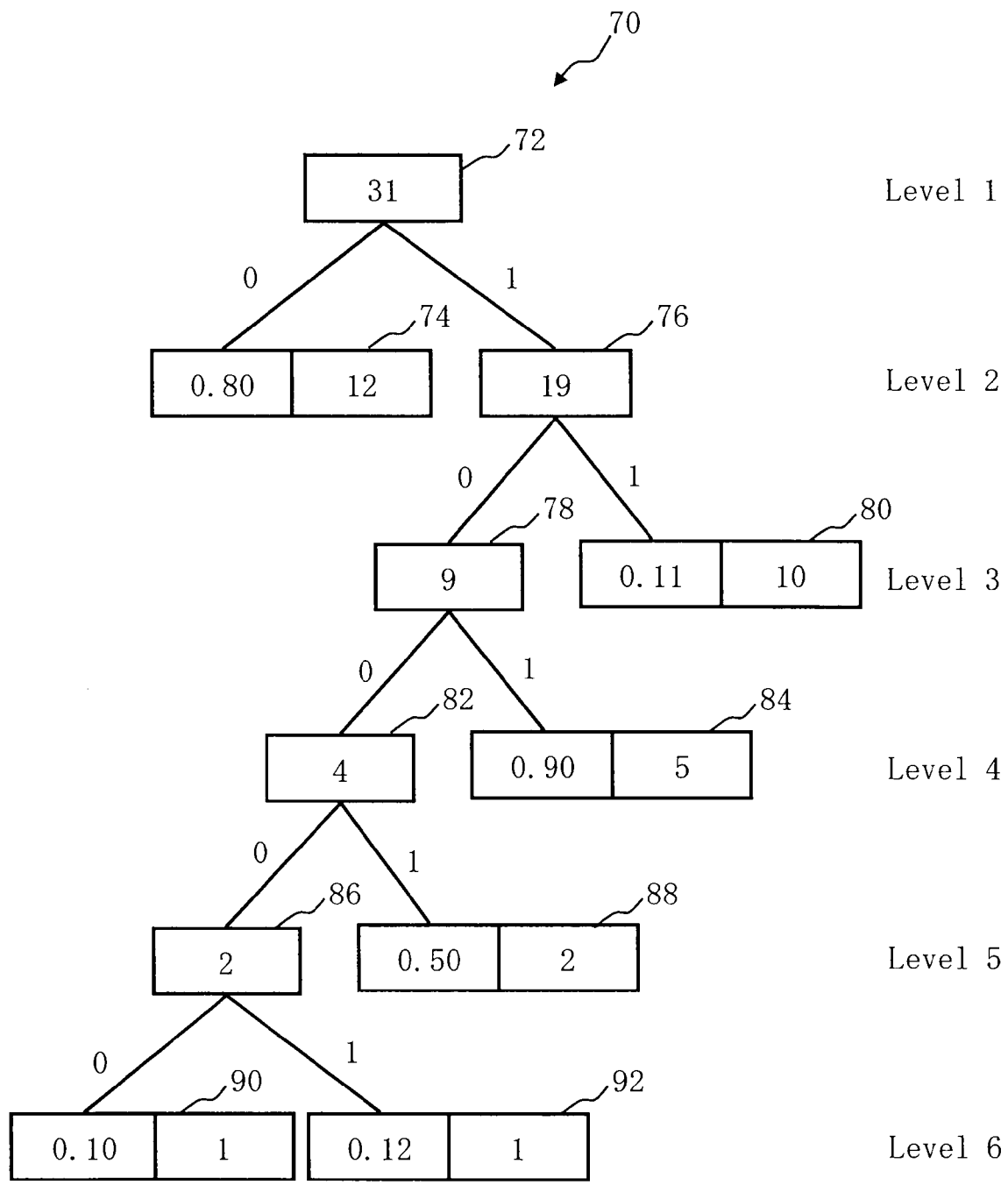
FIG. 6 shows an example of a Huffman tree corresponding to the accumulation table of FIG. 4.

FIG. 6 shows an example of the Huffman tree corresponding to the accumulation table of FIG. 4. In a Huffman tree 70 of FIG. 6, there are arranged a root node 72 in a level 1, leaf nodes 74 and 76 in a hierarchical level 2, leaf nodes 78 and 80 in a hierarchical level 3, leaf nodes 82 and 84 in a hierarchical level 4, leaf nodes 86 and 88 in a hierarchical level 5, and leaf nodes 90 and 92 in a hierarchical level 6. The root node 72 in the level 1 constitutes the beginning of the Huffman tree 70. Two level 1 branches are connected to the root node 72. At the end of one branch of the level 1, the leaf node 74 of a pattern information value whose number of using times is the largest is arranged. "0" of the binary digit is defined as this branch. At the end of the other branch of the level 1, the leaf node 76 of the hierarchical level 2 is arranged. "1" of the binary digit is defined as this branch. Two level 2 branches are connected to the leaf node 76. At the end of one branch of the level 2, the leaf node 78 of the hierarchical level 3 is arranged. "0" of the binary digit is defined as this branch. At the end of the other branch of the level 2, the leaf node 80 of a pattern information value whose number of using times is the second largest is arranged. "1" of the binary digit is defined as this branch. Two level 3 branches are connected to the leaf node 78. At the end of one branch of the level 3, the leaf node 82 of the hierarchical level 4 is arranged. "0" of the binary digit is defined as this branch. At the end of the other branch of the level 3, the leaf node 84 of a pattern information value whose number of using times is the third largest is arranged. "1" of the binary digit is defined as this branch. Two level 4 branches are connected to the leaf node 82. At the end of one branch of the level 4, the leaf node 86 of the hierarchical level 5 is arranged. "0" of the binary digit is defined as this branch. At the end of the other branch of the level 4, the leaf node 88 of a pattern information value whose number of using times is the fourth largest is arranged. "1" of the binary digit is defined as this branch. Two level 5 branches are connected to the leaf node 86. At the end of one branch of the level 5, the leaf node 90 of a pattern information value whose number of using times is the fifth largest is arranged as a hierarchical level 6. "0" of the binary digit is defined as this branch. At the end of the other branch of the level 5, the leaf node 92 of a pattern information value whose number of using times is also the fifth largest is arranged as a hierarchical level 6. "1" of the binary digit is defined as this branch. As each of the leaf nodes 72, 76, 78, 82, and 86, the total value of the numbers of using times of pattern information values of leaf nodes arranged in the level lower than the leaf node concerned is defined. Thus, the Huffman tree 70 is configured so that two pattern information values, whose numbers of using times are the smallest and the second smallest, may be the two leaf nodes in the lowest level of the hierarchy, and a pattern information value, whose number of using times is higher than that of lower level, may be a leaf node in the higher hierarchical level.

In step S118, as a Huffman table generating step, the Huffman table generating unit 54 reads the Huffman tree 70 from the memory 120, and, based on the Huffman tree 70, generates a Huffman table (second table) in which each pattern information corresponds to a variable length binary code generated by encoding (encrypting) the each pattern information. This encoding is performed in such a manner that the larger the number of using times of pattern information, the smaller the value of a variable length binary code. The Huffman table generating unit 54 is as an example of a second table generating unit. The generated Huffman table is stored in the memory 120.

FIG. 7 shows an example of the Huffman table corresponding to the Huffman tree of FIG. 6. Each pattern information value and each variable length binary code are correspondingly defined in the Huffman table 94 of FIG. 7. The variable length binary code is determined as follows in the Huffman tree 70. In order to reach the leaf node 74 of the pattern information value "0.80", whose number of using times is the largest, it is necessary to pass one branch of "0" of the binary digit from the root node 72. Therefore, the code of the value "0.80" becomes "0" of one bit. In order to reach the leaf node 80 of the pattern information value "0.11", whose number of using times is the second largest, it is necessary to pass the branch of "1" of the binary digit in the level 1 and the branch of "1" of the binary digit in the level 2 from the root node 72. Therefore, the code of the value "0.11" becomes "11" of two bits. In order to reach the leaf node 84 of the pattern information value "0.90", whose number of using times is the third largest, it is necessary to pass the branch of "1" of the binary digit in the level 1, the branch of "0" of the binary digit in the level 2, and the branch of "1" of the binary digit in the level 3 from the root node 72. Therefore, the code of the value "0.90" becomes "101" of three bits. In order to reach the leaf node 88 of the pattern information value "0.50", whose number of using times is the fourth largest, it is necessary to pass the branch of "1" of the binary digit in the level 1, the branch of "0" of the binary digit in the level 2, the branch of "0" of the binary digit in the level 3, and the branch of "1" of the binary digit in the level 4 from the root node 72. Therefore, the code of the value "0.50" becomes "1001" of four bits. In order to reach the leaf node 92 of the pattern information value "0.12", whose number of using times is the fifth largest, it is necessary to pass the branch of "1" of the binary digit in the level 1, the branch of "0" of the binary digit in the level 2, the branch of "0" of the binary digit in the level 3, the branch of "0" of the binary digit in the level 4, and the branch of "1" of the binary digit in the level 5 from the root node 72. Therefore, the code of the value "0.12" becomes "10001" of five bits. Moreover, in order to reach the leaf node 90 of the pattern information value "0.10", whose number of using times is also the fifth largest, it is necessary to pass the branch of "1" of the binary digit in the level 1, the branch of "0" of the binary digit in the level 2, the branch of "0" of the binary digit in the level 3, the branch of "0" of the binary digit in the level 4, and the branch of "0" of the binary digit in the level 5 from the root node 72. Therefore, the code of the value "0.12" becomes "10000" of five bits. In this way, encoding is performed in such a manner that the larger the number of using times of pattern information, the smaller the value of the variable length binary code. That is, the larger the number of using times of pattern information is, the smaller the number of bits is. Thus, the Huffman table 94, in which each acquired pattern information corresponds to a variable length binary code, is generated.

In step S120, as a format conversion step, the format converting unit 56 reads the Huffman table 94, and based on the Huffman table 94, converts data in a predetermined area defined by the writing data, into a predetermined format using the variable length binary codes. By converting the format of the writing data, intermediate data as a preliminary step to be converted into shot data can be generated.

Figure 8:
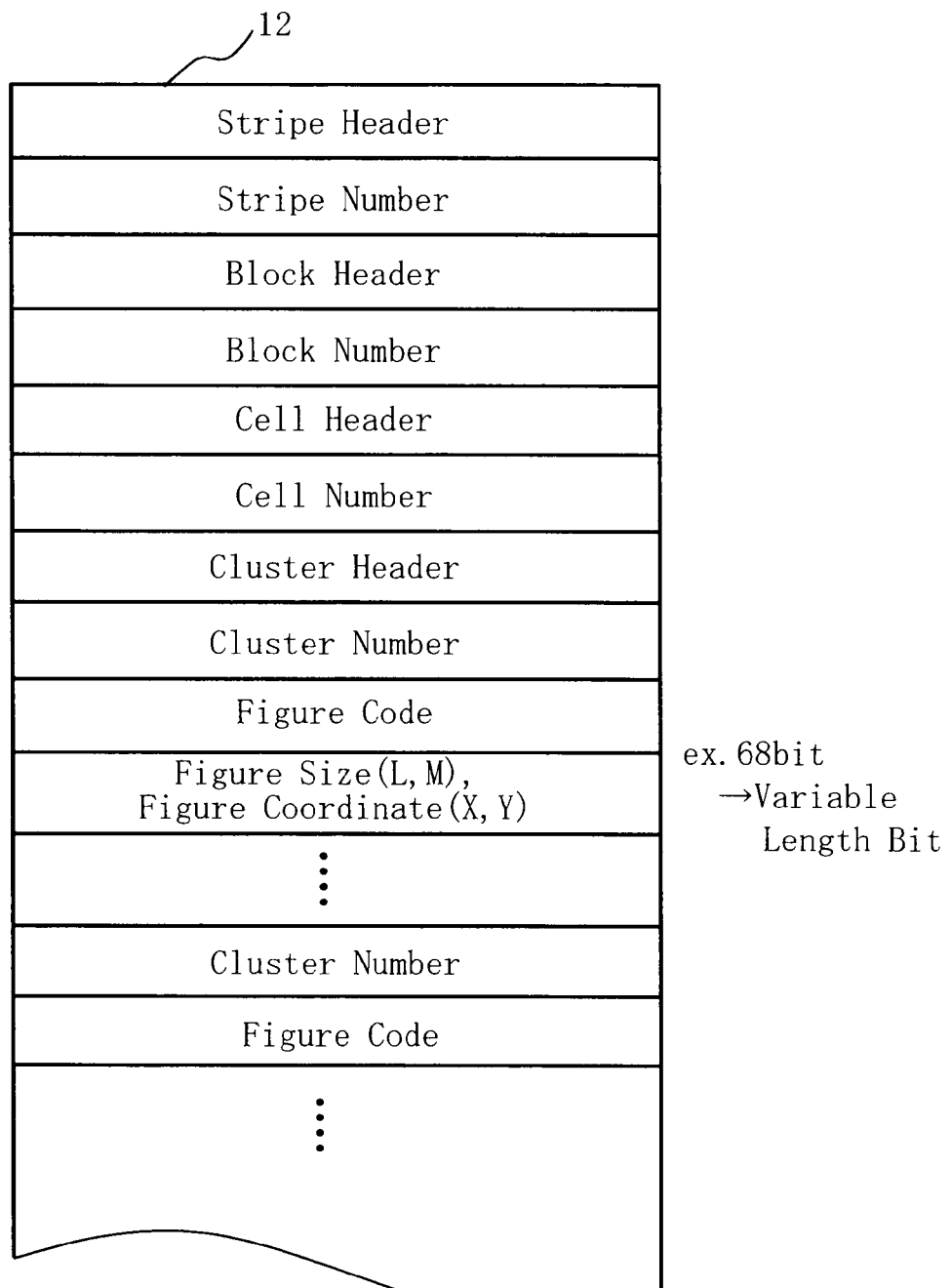
FIG. 8 shows an example of intermediate data according to Embodiment 1.

FIG. 8 shows an example of the intermediate data according to Embodiment 1. In generated intermediate data 12 of FIG. 8, following a stripe header, a stripe number, and a block header and a block number relating to block data in the stripe concerned are defined. Following the block number, a cell header and a cell number relating to cell data arranged in the block concerned, and a cluster header and a cluster number relating to cluster data arranged in the cell concerned are defined. Then, following the cluster number, a figure code is defined. Following the figure code, a figure size (L, M) and a figure coordinate (x, y) are defined. Following the first figure, the figure code, the figure sizes (L, M), and the figure coordinates (X, Y) are defined for a second figure 62 arranged in the same cluster 34. In this way, after defining all the figures in one cluster 34, a cluster header and a cluster number of the next cluster 34 are defined. Then, defining is performed similarly. The figure sizes (L, M) and the figure coordinates (X, Y) are defined by reading each code from the Huffman table 94 and connecting them as a series of sequence codes.

As mentioned above, when a plurality of figures are arranged in the cluster 34, pattern information including the figure size and the position coordinate value of the figure is encoded into a variable length binary code, for each of a plurality of figures. Then, data, in which a variable length binary code of the figure size and a variable length binary code of the position coordinate value of the figure are consecutive, is defined for each of a plurality of figures.

In the conventional format, 17 bits for the size L and 17 bits for the size M, for example, are needed to define the figure sizes (L, M), and 17 bits for X and 17 bits for Y, for example, are needed to define the coordinates (X, Y). That is, totally 68 bits are needed. In contrast, in the intermediate data 12 of FIG. 8, L and M of the figure sizes and x and y of the coordinates is respectively the sum of bit values of variable length binary codes. Here, if the pattern information whose number of using times is the largest is the value "0.80", for example, it is sufficient to use one bit of "0". Therefore, effect of reducing 16 bits is produced. If all of the values of L, M, x, and y are "0.80" respectively, for example, it is enough to use four bits of "0000", while conventionally sixty-eight bits are needed.

For example, when three thousand figures are arranged in one cluster 34, twelve thousand bits are totally used for the values of L, M, x, and y. Even if the number of using times of each of all is once, the number of bits of the longest code can be smaller than the conventional seventeen bits by using the Huffman tree. According to Embodiment 1, since the larger the number of using times of pattern information, the smaller the number of bits of the code, the effect of reducing the number of bits is enormous.

Thus, by virtue of the configuration mentioned above, the larger the number of using times of pattern information, the smaller the value of the variable length binary code in the Huffman table. Then, the smaller the value, the smaller the number of bits to be used. Therefore, data in the cluster 34 is converted into a predetermined format using variable length binary codes. That is, each pattern information of the data in the converted cluster 34 is defined by a variable length binary code. Since the larger the number of using times of pattern information, the smaller the number of bits used for defining the pattern information, thereby reducing the number of bits used for the data in the converted cluster 34.

The intermediate data in each cluster, whose number of bits has been greatly reduced by the conversion mentioned above, is stored in the magnetic disk unit 122. Moreover, the Huffman table 94 is also stored in the magnetic disk unit 122.

In step S122, as a shot data generating step, the shot data generating unit 124 reads intermediate data and the Huffman table 94 from the magnetic disk unit 122, to generate shot data. Concretely, the shot data generating unit 124 needs just to develop the intermediate data, with reference to the Huffman table 94, by replacing a sequence code, which defines the figure size (L, M) and the figure coordinate (x, y) defined by the read intermediate data, with an original value, and to divide each figure into shot figures. The shot data generated as mentioned above is stored in the magnetic disk unit 126.

Figure 9:
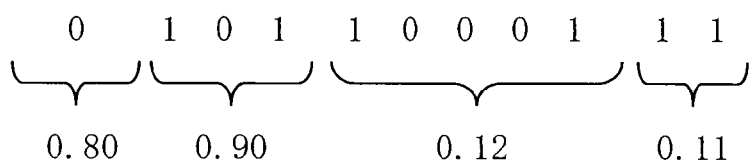
FIG. 9 shows an example of a sequence code which defines figure sizes (L, M) and figure coordinates (x, y) according to Embodiment 1.

FIG. 9 shows an example of a sequence code which defines the figure size (L, M) and the figure coordinate (x, y) according to Embodiment 1. For example, in FIG. 9, when defined by the code "01011000111", and the figure sizes (L, M) and the figure coordinates (x, y) of the intermediate data, it is judged as follows based on the read Huffman table 94. First, "0" at the beginning indicates that the L value of the figure size is "0.80." Then, "101" indicates that the M value of the figure size is "0.90." Next, "10001" indicates that the x value of the figure coordinate is "0.12." Then, "11" at the end indicates that the y value of the figure coordinate is "0.11."

The writing unit 150 writes a plurality of patterns to be arranged in a cluster, onto the target workpiece 101 as follows, by using an electron beam 200 controlled by shot data based on the data in the cluster, which has been converted into a plurality of formats as mentioned above. The writing unit 150 is controlled by the writing control unit 130.

The electron beam 200 emitted from the electron gun assembly 201 irradiates the entire first aperture plate 203 having an opening or "hole" in the shape of a rectangle by using the illumination lens 202. At this point, the electron beam 200 is shaped to be a rectangle. Such a rectangular shape may be a square, rhombus, rhomboid, etc. Then, after having passed through the first shaping aperture plate 203, the electron beam 200 of a first aperture image is projected onto the second aperture plate 206 by the projection lens 204. The position of the first aperture image on the second aperture plate 206 is controlled by the deflector 205, and the shape and size of the beam can be changed. After passing through the second aperture plate 206, the electron beam 200 of a second aperture image is focused by the objective lens 207 and deflected by the deflector 208 to reach a desired position on the target workpiece 101 placed on the XY stage 105 which is movably arranged.

Figure 10A:
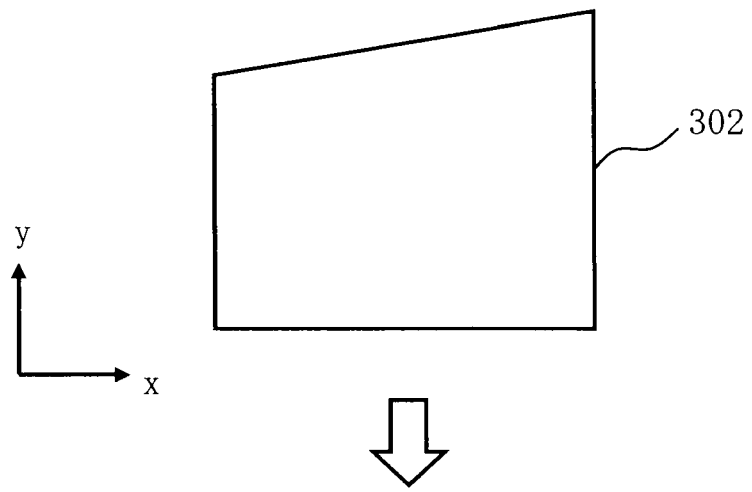
FIGS. 10A-10C are schematic diagrams describing an effect of reducing the number of bits when slitting a figure having an arbitrary angle according to Embodiment 1.
Figure 10B:
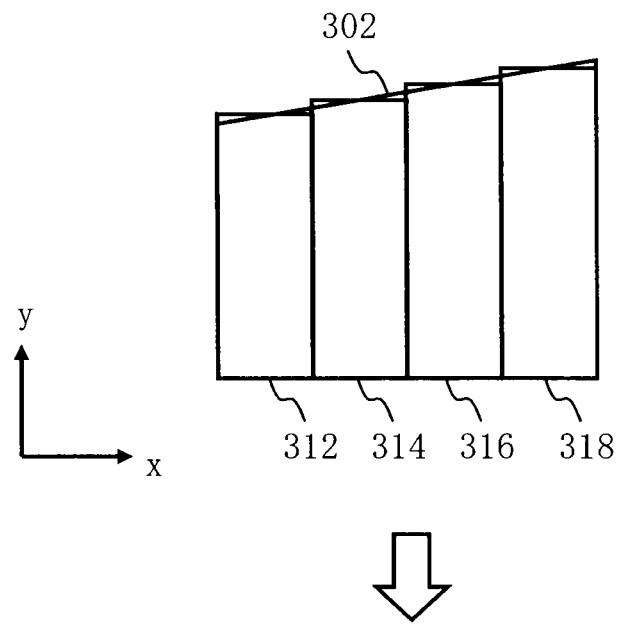
Figure 10C:
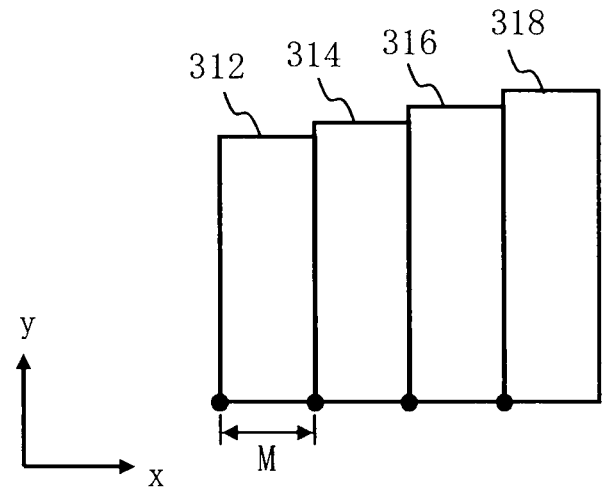
Figure 11:
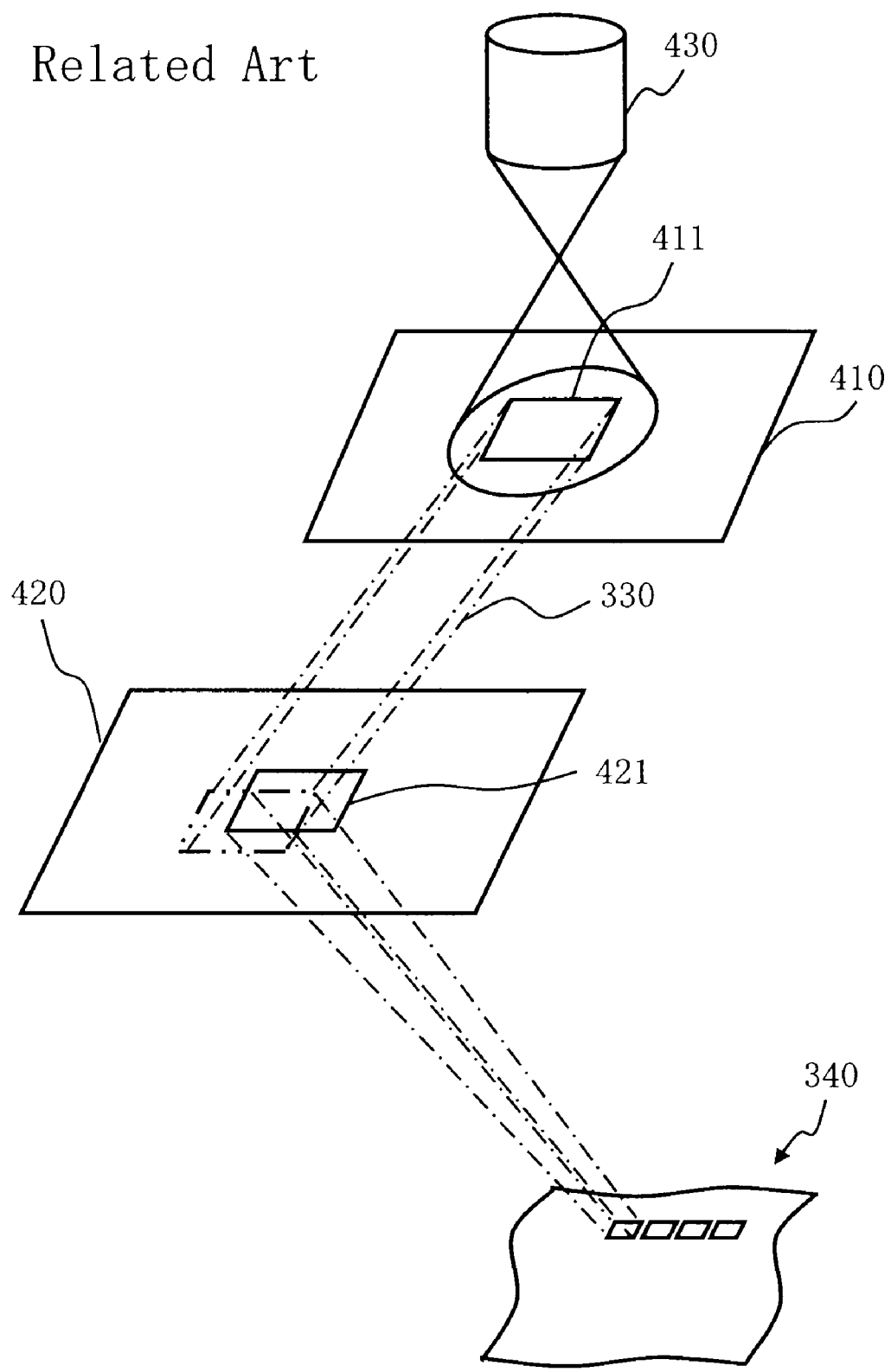
FIG. 11 is a schematic diagram illustrating operations of a variable-shaped electron beam type writing apparatus.

FIGS. 10A-10C are schematic diagrams describing the effect of reducing the number of bits when slitting a figure having an arbitrary angle according to Embodiment 1. FIG. 10A shows a figure 302 having an arbitrary angle. The figure having an arbitrary angle indicates a figure with an angle other than an integral multiple of 45°. Since it is difficult to form the electron beam 200 into such a figure 302 having an arbitrary angle, the figure 302 having an arbitrary angle is divided into a plurality of rectangles or trapezoids composed of only integral multiple of 45°. FIG. 10B shows the case where the figure 302 having an arbitrary angle is divided into four rectangles 312, 314, 316, and 318. In this case, intermediate data defines the figure sizes (L, M) and the figure coordinates (x, y) of the four rectangles 312, 314, 316, and 318. Then, if dividing is performed by the same width M in the x direction as shown in FIG. 10C, all of the width M values of the four rectangles 312, 314, 316, and 318 can be the same value. Therefore, the number of using times is increased, and the number of bits can be reduced, because of the increased number of the using times, by using the Huffman tree. Moreover, as to the figure coordinates (x, y), when regarding the corner at the bottom left as a reference position of the figure, all of y values of the four rectangles 312, 314, 316, and 318 can be the same value. Therefore, the number of using times increases and the number of bits can be reduced by using the Huffman tree.

Now, the effect of reducing the number of bits is verified using certain writing data. An example of a wiring pattern of 90 nm generation is verified, and the cluster size in this verification is 6.4 μm. According to the conventional method, the sum of the bits required to represent the figure codes, the figure sizes (L, M) and the figure coordinates (x, y) of intermediate data is 10880 bits. In contrast, according to the present Embodiment, the sum of the bits required to represent the figure codes, the figure sizes (L, M) and the figure coordinates (x, y) of intermediate data can be reduced to 4999 bits. Thereby, it becomes possible to reduce to 54%.

As mentioned above, according to the present Embodiment, by encoding the figure sizes (L, M) and the figure coordinates (x, y) into variable length binary codes by using the Huffman tree, the larger the number of using times of pattern information is, the smaller the number of bits used for defining the pattern information is. Therefore, the entire number of bits used can be greatly reduced. Thereby, the number of bits of intermediate data can be largely reduced. Consequently, the data size of the intermediate data can be enormously reduced, and writing time can be greatly shortened. As a result, throughput of the apparatus can be significantly improved.

While the embodiments have been described above with reference to specific examples, the present invention is not limited to these specific ones. For example, although the format is selected for each cluster, it is not limited thereto. For example, the format may be selected for each cell.

While description of the apparatus structure, control method, etc. not directly required for explaining the present invention is omitted, some or all of them may be suitably selected and used when needed. For example, although the structure of the control unit for controlling the writing apparatus 100 is not described, it should be understood that a necessary control unit structure is to be selected and used appropriately.

In addition, any other apparatus and method for generating writing data, apparatus and method for converting writing data, and apparatus and method for writing with a charged particle beam that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A writing apparatus comprising:
   a storage unit configured to store writing data;
   an acquiring unit configured to acquire pattern information on a plurality of patterns defined in the writing data, based on the writing data;
   a first table generating unit configured to generate a first table in which each pattern information corresponds to a number of times of using the each pattern information, based on acquired pattern information, for each predetermined region;
   a Huffman tree generating unit configured to generate a Huffman tree, based on the first table;
   a second table generating unit configured to generate a second table in which the each pattern information corresponds to a variable length binary code generated by encoding the each pattern information in such a manner that the larger the number of times of using the each pattern information is, the smaller a value of the variable length binary code is, based on the Huffman tree;
   a converting unit configured to convert data, which is defined by the writing data, in the predetermined region into a predetermined format using the variable length binary code, based on the second table; and
   a writing unit configured to write the plurality of patterns defined, onto a target workpiece, based on converted data in the predetermined region.

2. The apparatus according to claim 1, wherein the each pattern information encoded by the variable length binary code includes a size of a figure.

3. The apparatus according to claim 1, wherein the each pattern information encoded by the variable length binary code includes a position coordinate value of a figure.

4. The apparatus according to claim 1, wherein the pattern information encoded by the variable length binary code includes a size and a position coordinate value of a figure.

5. The apparatus according to claim 1, wherein converted data in the predetermined region includes data in which the variable length binary code of a size of a figure and the variable length binary code of a position coordinate value of the figure are consecutive.

6. The apparatus according to claim 1, wherein, when a plurality of figures are arranged in the predetermined region, the pattern information is encoded into the variable length binary code, for each of the plurality of figures.

7. The apparatus according to claim 6, wherein the pattern information on each figure, which is encoded into the variable length binary code, includes a size of a corresponding figure and a position coordinate value of the corresponding figure.

8. The apparatus according to claim 7, wherein data, in which the variable length binary code of the size of the corresponding figure and the variable length binary code of the position coordinate value of the corresponding figure are consecutive, is defined for the each of the plurality of figures.

9. A method for converting writing data comprising: using a computer,
   inputting writing data;
   acquiring pattern information on a plurality of patterns defined in the writing data, based on the writing data;
   generating a first table in which each pattern information corresponds to a number of times of using the each pattern information, based on acquired pattern information, for each predetermined region;
   generating a Huffman tree, based on the first table;
   generating a second table in which the each pattern information corresponds to a variable length binary code generated by encoding the each pattern information in such a manner that the larger the number of times of using the each pattern information is, the smaller a value of the variable length binary code is, based on the Huffman tree;
   converting data, which is defined by the writing data, in the predetermined region into a predetermined format using the variable length binary code, based on the second table; and
   storing converted data in the predetermined region.

10. A non-transitory computer-readable recording medium storing a program to be executed by a computer, the program comprising:
    storing writing data, in which pattern information on a plurality of patterns is defined, in a storage device;
    acquiring pattern information on a plurality of patterns defined in the writing data which is read from the storage device;
    generating a first table in which each pattern information corresponds to a number of times of using the each pattern information, based on acquired pattern information, for each predetermined region;
    generating a Huffman tree, based on the first table;
    generating a second table in which the each pattern information corresponds to a variable length binary code generated by encoding the each pattern information in such a manner that the larger the number of times of using the each pattern information is, the smaller a value of the variable length binary code is, based on the Huffman tree;
    converting data, which is defined by the writing data, in the predetermined region into a predetermined format using the variable length binary code, based on the second table; and
    storing converted data in the predetermined region.

* * * * *